(12) United States Patent
Wang et al.

(10) Patent No.: US 7,939,990 B2
(45) Date of Patent: May 10, 2011

(54) THIN-FILM BULK ACOUSTIC RESONATORS HAVING PERFORATED BODIES THAT PROVIDE REDUCED SUSCEPTIBILITY TO PROCESS-INDUCED LATERAL DIMENSION VARIATIONS

(75) Inventors: Ye Wang, Cupertino, CA (US); Harmeet Bhugra, San Jose, CA (US)

(73) Assignee: Integrated Device Technology, Inc., San Jose, CA (US)

( * ) Notice: Subject to any disclaimer, the term of this patent is extended or adjusted under 35 U.S.C. 154(b) by 205 days.

(21) Appl. No.: 12/393,566

(22) Filed: Feb. 26, 2009

(65) Prior Publication Data

US 2010/0194241 A1 Aug. 5, 2010

Related U.S. Application Data

(63) Continuation-in-part of application No. 12/363,142, filed on Jan. 30, 2009.

(51) Int. Cl.
*H01L 41/09* (2006.01)
(52) U.S. Cl. .................. 310/320; 310/324; 310/368
(58) Field of Classification Search .......... 310/320, 310/324, 328, 367, 368
See application file for complete search history.

(56) References Cited

U.S. PATENT DOCUMENTS

| | | | |
|---|---|---|---|
| 5,160,901 A | 11/1992 | Stone | |
| 5,229,735 A | 7/1993 | Quan | |
| 5,640,133 A | 6/1997 | MacDonald et al. | |
| 6,557,419 B1 | 5/2003 | Herb et al. | |
| 6,604,266 B1 | 8/2003 | Tajima et al. | |
| 6,657,363 B1 | 12/2003 | Aigner | |
| 6,739,190 B2 | 5/2004 | Hsu et al. | |
| 7,199,504 B2 | 4/2007 | Komuro et al. | |
| 7,202,761 B2 | 4/2007 | Lutz et al. | |
| 7,280,007 B2 | 10/2007 | Feng et al. | |
| 7,312,674 B2 | 12/2007 | Duwel et al. | |
| 7,446,620 B2 | 11/2008 | Partridge et al. | |
| 7,489,063 B2 | 2/2009 | Isobe et al. | |
| 7,608,980 B2 | 10/2009 | Kataoka | |
| 7,616,077 B1 * | 11/2009 | Wittwer et al. | ............... 333/186 |
| 7,639,104 B1 | 12/2009 | Quevy et al. | |
| 7,675,389 B2 | 3/2010 | Yamakawa et al. | |

(Continued)

FOREIGN PATENT DOCUMENTS

EP 1 217 735 A1 6/2002

(Continued)

OTHER PUBLICATIONS

"Film Bulk Acoustic-Wave Resonator (FBAR)," Admitted Prior Art, http://mems.usc.edu/fbar.htm, Printed from the Internet Oct. 14, 2008, 3 pages.

(Continued)

*Primary Examiner* — Thomas M Dougherty
(74) *Attorney, Agent, or Firm* — Myers, Bigel, et al.

(57) ABSTRACT

Micro-electromechanical acoustic resonators include a resonator body suspended over a substrate. The resonator body may have a single perforation therein, which may extend substantially or completely therethrough. The resonator body may also be configured to have a center-of-mass within an interior of the perforation and/or a nodal line that overlaps the perforation. A perimeter and depth of the single perforation can be configured to reduce a susceptibility of the acoustic resonator to process-induced variations in resonant frequency relative to an otherwise equivalent resonator that omits the single perforation. In other embodiments, the resonator body may have multiple perforations therein that extend along a nodal line of the resonator.

20 Claims, 8 Drawing Sheets

U.S. PATENT DOCUMENTS

| | | | |
|---|---|---|---|
| 2002/0096967 | A1 | 7/2002 | Ma et al. |
| 2005/0146248 | A1 | 7/2005 | Moler et al. |
| 2005/0242904 | A1 | 11/2005 | Lutz et al. |
| 2006/0125576 | A1 | 6/2006 | Ho et al. |
| 2006/0196273 | A1* | 9/2006 | Burns .............................. 73/702 |
| 2006/0225504 | A1* | 10/2006 | Ayazi et al. ................ 73/504.12 |
| 2007/0069612 | A1 | 3/2007 | Sato |
| 2007/0220971 | A1* | 9/2007 | Ayazi et al. ................ 73/504.02 |
| 2007/0277620 | A1 | 12/2007 | Melamud et al. |
| 2008/0143217 | A1 | 6/2008 | Ho et al. |
| 2008/0186109 | A1 | 8/2008 | Ho et al. |
| 2009/0153267 | A1 | 6/2009 | Lutz et al. |
| 2009/0160581 | A1 | 6/2009 | Hagelin et al. |
| 2010/0032789 | A1 | 2/2010 | Schoen et al. |

FOREIGN PATENT DOCUMENTS

| | | |
|---|---|---|
| EP | 2 144 369 A1 | 1/2010 |
| WO | WO 2007/072409 A2 | 6/2007 |

OTHER PUBLICATIONS

"Finite element method," Admitted Prior Art, http://en.wikipedia.org/wiki/Finite_element_method, Printed from the Internet Oct. 28, 2008, 7 pages.

Kim et al., "Micromechanical Resonant Displacement Gain Stages," IEEE, 2009, pp. 19-22.

Invitation to Pay Additional Fees and, Where Applicable, Protest Fee, PCT/US2010/022510, Jun. 4, 2010.

Notification of Transmittal of The International Search Report and the Written Opinion of the International Searching Authority, or the Declaration, Written Opinion of the International Searching Authority, International Application No. PCT/US2010/022510, date of mailing Aug. 25, 2010, 19 pages.

Abdolvand et al., "A Low Voltage Temperature-Stable Micromechanical Piezoelectric Oscillator," *Digest of the 14th International Conference on Solid State Sensors, Actuators and Microsystems*(Transducers '07), Lyon, France, Jun. 2007, pp. 53-56.

Abdolvand et al., "A Temperature-Compensated ZnO-on-Diamond Resonant Mass Sensor," *Proc. 5th IEEE Conference on Sensors*, 2006, pp. 1297-1300.

Abdolvand et al., "Single-Resonator Dual-Frequency Thin-Film Piezoelectric-on-Substrate Oscillator", *IEEE International Electron Devices Meeting*, 2007, pp. 419-422.

Ho et al., "High Order Composite Bulk Acoustic Resonators," *Proc. 20th IEEE International Conference on Micro Electro Mechanical Systems* (MEMS '07), Kobe, Japan, Jan. 2007, pp. 791-794.

Ho et al., "Temperature Compensated IBAR Reference Oscillators," *Proc. 19th IEEE International Conference on Micro Electro Mechanical System*, (MEMS '06), Istanbul, Turkey, Jan. 2006, pp. 910-913.

Lin et al., "Series-Resonant VHF Micromechanical Resonator Reference Oscillators," *IEEE Journal of Solid-State Circuits*, vol. 39, No. 12, Dec. 2004, pp. 2477-2491.

Notification of Transmittal of the International Search Report and the Written Opinion of the International Searching Authority, or the Declaration; International Search Report; Written Opinion of the International Searching Authority, PCT Application No. PCT/US2008/010844, Jun. 24, 2009.

Schodowski, "Resonator Self-Temperature-Sensing Using A Dual-Harmonic-Mode Crystal Oscillator," *Proc. of the 43rd Annual Symposium on Frequency Control*, Jun. 1989, pp. 2-7.

Sundaresan et al., "A Low Phase Noise 100MHz Silicon BAW Reference Oscillator," *Proc. IEEE Custom Integrated Circuits Conference*, Sep. 2006, pp. 841-844.

Vig, "Dual-mode Oscillators for Clocks and Sensors," *Procs. IEEE Ultrasonics Symposium*, vol. 2, No., 1999, pp. 859-868.

Baborowski et al., "Piezoelectrically Activated Silicon Resonators", IEEE Frequency Control Symposium, 2007 Joint with the 21$^{st}$ European Frequency and Time Forum, May 1, 2007, pp. 1210-1213, XP031138158, section I.

Casinovi et al., "Analytical Modeling and Numerical Simulation of Capacitive Silicon Bulk Acoustic Resonators," IEEE International Conference on Micro Electro Mechanical Systems, Jan. 2009, pp. 935-938.

Dubois, Marc-Alexandre., "Thin film bulk acoustic wave resonators: a technology overview," MEMSWAVE 03, Toulouse, France, Jul. 2-4, 2003.

Jaakkola et al., "Piezoelectrically transduced Single-Crystal-Silicon Plate Resonators," VTT Technical Research Centre of Finland, Finland.

Kim et al., "Temperature Dependence of Quality Factor in MEMS Resonators," Journal of Microelectromechanical Systems, vol. 17, No. 3, Jun. 2008, pp. 755-766.

Luoto et al., "MEMS on cavity-SOI wafers," Solid State Electronics 51:328-332 (2007).

Nam et al., "Piezoelectric Properties of Aluminum Nitride for Thin Film Bulk Acoustic Wave Resonator," J. Korean Physical Society, 47:S309-S312 (2005).

Pourkamali et al., "Low-impedance VHF and UHF Capacitive Silicon Bulk Acoustic Wave Resonators—Part I: Concept and Fabrication," IEEE Transaction On Electron Devices, vol. 54, No. 8, Aug. 2007, pp. 2017-2023.

Schoen et al., "Temperature Compensation in Silicon-Based Micro-Electromechanical Resonators", IEEE Conference on Micro Electromechanical Systems 2009, Jan. 25, 2009, pp. 884-887, XP031444436, figures 1-3.

\* cited by examiner

THIN-FILM BULK ACOUSTIC RESONATORS HAVING PERFORATED BODIES THAT PROVIDE REDUCED SUSCEPTIBILITY TO PROCESS-INDUCED LATERAL DIMENSION VARIATIONS

CROSS-REFERENCE TO RELATED APPLICATION

This application is a continuation-in-part of U.S. application Ser. No. 12/363,142, filed Jan. 30, 2009, the disclosure of which is hereby incorporated herein by reference.

FIELD OF THE INVENTION

The present invention relates to integrated circuit devices and, more particularly, to micro-electromechanical devices and methods of forming same.

BACKGROUND OF THE INVENTION

Micro-electromechanical (MEMs) resonators that are operated in a lateral bulk extension mode may have several critical parameters that can influence resonator operating frequency. Some of these critical parameters can be highlighted by modeling performance of a resonator using a simplified bulk acoustic wave equation: $f=v/(2L)$, where f is a resonant frequency, v is an acoustic velocity of the resonator material and L is the lateral dimension of a resonator body along an axis of vibration. For a bulk acoustic resonator containing a resonator body with a composite stack of layers thereon, the acoustic velocity is a function of the Young's modulus, density and thickness of the resonator body and each of the stack of layers.

Accordingly, because the thicknesses of all of the layers may vary during deposition processes, variations in resonant frequency may be present between otherwise equivalent devices formed across a wafer(s). For example, variations in thicknesses of 1-2% across a wafer may cause significant deviations in frequency on the order of several thousands of parts-per-million (ppm). The same is true for process-induced variations in the lateral dimensions of the resonator body, which may be caused by photolithographic and etching variations across a substrate (e.g., wafer) and batch processing of multiple substrates. These variations in lateral dimension can come from variations in the photolithographic patterning of the resonator body and from variations in sidewall angle during etching processes that separate the resonator body from a surrounding substrate. Unfortunately, these dimensional variations may cause a frequency drift on the order of several thousand ppm for a resonator operating in the megahertz resonant frequency range.

SUMMARY OF THE INVENTION

Micro-electromechanical acoustic resonators according to embodiments of the present invention include a resonator body that is anchored on opposite sides to a substrate having a recess therein that extends underneath the resonator body. The resonator body is also configured to have at least one perforation therein, which may extend at least substantially therethrough. The perforation can be located along a nodal line of the resonator body, which extends between the opposite sides of the resonator body that are anchored to the substrate.

In particular, a shape, depth and location of the single perforation can be configured to reduce a susceptibility of the acoustic resonator to process-induced variations in resonant frequency caused by body dimensional variations, relative to an otherwise equivalent resonator that omits the single perforation. For example, according to some of these embodiments of the invention, the resonator body may be configured so that a center-of-mass of the resonator body is within an interior of the single perforation. According to other embodiments of the invention, the resonator body may be configured so that a projected center-of-stress is within an interior of the single perforation.

According to still further embodiments of the present invention, the resonator body can be configured so that a sidewall of the resonator body is separated from an opposing sidewall of a supporting substrate by a distance equivalent to a width of the single perforation. Moreover, a length ($L_s$) and a width ($W_s$) of the single perforation may be related to a length ($L_{rb}$) and a width ($W_{rb}$) of the resonator body by the following relationship:

$$(0.4)L_{rb}(W_s/2(L_{rb}-W_{rb}+W_s))^{1/2} \leq L_s \leq (0.6)L_{rb}(W_s/2(L_{rb}-W_{rb}+W_s))^{1/2},$$

where the length ($L_{rb}$) is greater than the width ($W_{rb}$), and the length ($L_s$) is greater than the width ($W_s$).

According to still further embodiments of the present invention, a micro-electromechanical acoustic resonator includes a resonator body anchored on opposite sides to a substrate having a recess therein that extends underneath the resonator body. This resonator body includes at least one perforation therein. The at least one perforation has a length ($L_s$) and a width ($W_s$) that are related to a length ($L_{rb}$) and a width ($W_{rb}$) of the resonator body by the following relationship:

$$(0.4)L_{rb}(W_s/2(L_{rb}-W_{rb}+W_s))^{1/2} \leq L_s \leq (0.6)L_{rb}(W_s/2(L_{rb}-W_{rb}+W_s))^{1/2},$$

where the length ($L_{rb}$) is greater than the width ($W_{rb}$), and the length ($L_s$) is greater than the width ($W_s$). According to additional embodiments of the invention, the at least one perforation is a plurality of perforations that conform to the relationship.

A micro-electromechanical acoustic resonator may also include a rectangular-shaped resonator body suspended above a recess in a substrate. The resonator body may have a substantially rectangular perforation extending entirely therethrough. The rectangular perforation may have a length ($L_s$) and a width ($W_s$) that is related to a length ($L_{rb}$) and a width ($W_{rb}$) of the resonator body by the following relationship:

$$L_s = (0.5)L_{rb}(W_s/2(L_{rb}-W_{rb}+W_s))^{1/2}, \text{ where } L_s > W_s.$$

A sidewall of the resonator body may also be separated from an opposing sidewall of the substrate by a distance equivalent to $W_s$.

A micro-electromechanical acoustic resonator according to still further embodiments of the invention includes a resonator body anchored on opposite sides to a substrate having a recess therein extending underneath the resonator body. The resonator body has "N" perforations therein extending at least substantially therethrough, where "N" is an integer greater than one. At least one of the "N" perforations has a length ($L_s$) and width ($W_s$) that are related to a length ($L_{rb}$) and a width ($W_{rb}$) of the resonator body by the following relationship:

$$(0.4)L_{rb}(W_s/2(L_{rb}-(W_{rb}/N)+W_s))^{1/2} \leq L_s \leq (0.6)L_{rb}(W_s/2(L_{rb}-(W_{rb}/N)+W_s))^{1/2},$$

for the case where the length ($L_{rb}$) is less than the width ($W_{rb}$). The resonator body may also be configured to have a center-of-mass within an interior of one of the plurality of perforations. The "N" perforations may also be arranged in a line across the resonator body, which may be collinear with a nodal line of the resonator body. According to still further embodiments of the invention, the resonator body may be configured to have a projected point of maximum stress within an interior of a first one of the "N" perforations when the resonator body is operating at a resonant frequency. The "N" perforations may also be configured so that a center-to-center pitch between the first one of the "N" perforations and a second one of the "N" perforations is equivalent to $\lambda/4$, where $\lambda$ is a wavelength associated with a resonant frequency of the resonator.

A micro-electromechanical acoustic resonator according to additional embodiments of the invention includes resonator body, which is suspended over a recess within a substrate. The resonator body is formed to have a single perforation therein, which extends at least substantially therethrough. The single perforation has dimensions that are sufficient to reduce a susceptibility of the resonator to process-induced variations in resonant frequency relative to an otherwise equivalent resonator that omits the single perforation. In particular, the perforation may be sized so that a sidewall of the resonator body is separated from an opposing sidewall of the substrate by a distance equivalent to a width of the perforation.

According to still further embodiments of the present invention, the acoustic resonator includes a resonator body, which is suspended over the substrate. The resonator body has at least one perforation extending therethrough. The resonator body is also configured to have a projected point of maximum stress within an interior of the at least one perforation when the resonator is operating at a resonant frequency. The at least one perforation may also have a length ($L_s$) and a width ($W_s$) that are related to a length ($L_{rb}$) and a width ($W_{rb}$) of the resonator body by the following relationship:

$$(0.4)L_{rb}(W_s/2(L_{rb}-W_{rb}+W_s))^{1/2} \leq L_s \leq (0.6)L_{rb}(W_s/2(L_{rb}-W_{rb}+W_s))^{1/2},$$

where the length ($L_{rb}$) is greater than the width ($W_{rb}$), and the length ($L_s$) is greater than the width ($W_s$).

DESCRIPTION OF PREFERRED EMBODIMENTS

The present invention now will be described more fully with reference to the accompanying drawings, in which preferred embodiments of the invention are shown. This invention may, however, be embodied in many different forms and should not be construed as being limited to the embodiments set forth herein; rather, these embodiments are provided so that this disclosure will be thorough and complete, and will fully convey the scope of the invention to those skilled in the art. Like reference numerals refer to like elements throughout.

It will be understood that when an element or layer is referred to as being "on," "connected to" or "coupled to" another element or layer (and variants thereof), it can be directly on, connected or coupled to the other element or layer or intervening elements or layers may be present. In contrast, when an element is referred to as being "directly on," "directly connected to" or "directly coupled to" another element or layer (and variants thereof, there are no intervening elements or layers present. Like reference numerals refer to like elements throughout. As used herein, the term "and/or" includes any and all combinations of one or more of the associated listed items and may be abbreviated as "/".

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the present invention. As used herein, the singular forms "a," "an" and "the" are intended to include the plural forms as well, unless the context clearly indicates otherwise. It will be further understood that the terms "comprising", "including", having" and variants thereof, when used in this specification, specify the presence of stated features, steps, operations, elements, and/or components, but do not preclude the presence or addition of one or more other features, steps, operations, elements, components, and/or groups thereof. In contrast, the term "consisting of" when used in this specification, specifies the stated features, steps, operations, elements, and/or components, and precludes additional features, steps, operations, elements and/or components.

Embodiments of the present invention are described herein with reference to cross-section and perspective illustrations that are schematic illustrations of idealized embodiments (and intermediate structures) of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, a sharp angle may be somewhat rounded due to manufacturing techniques/tolerances.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 1:
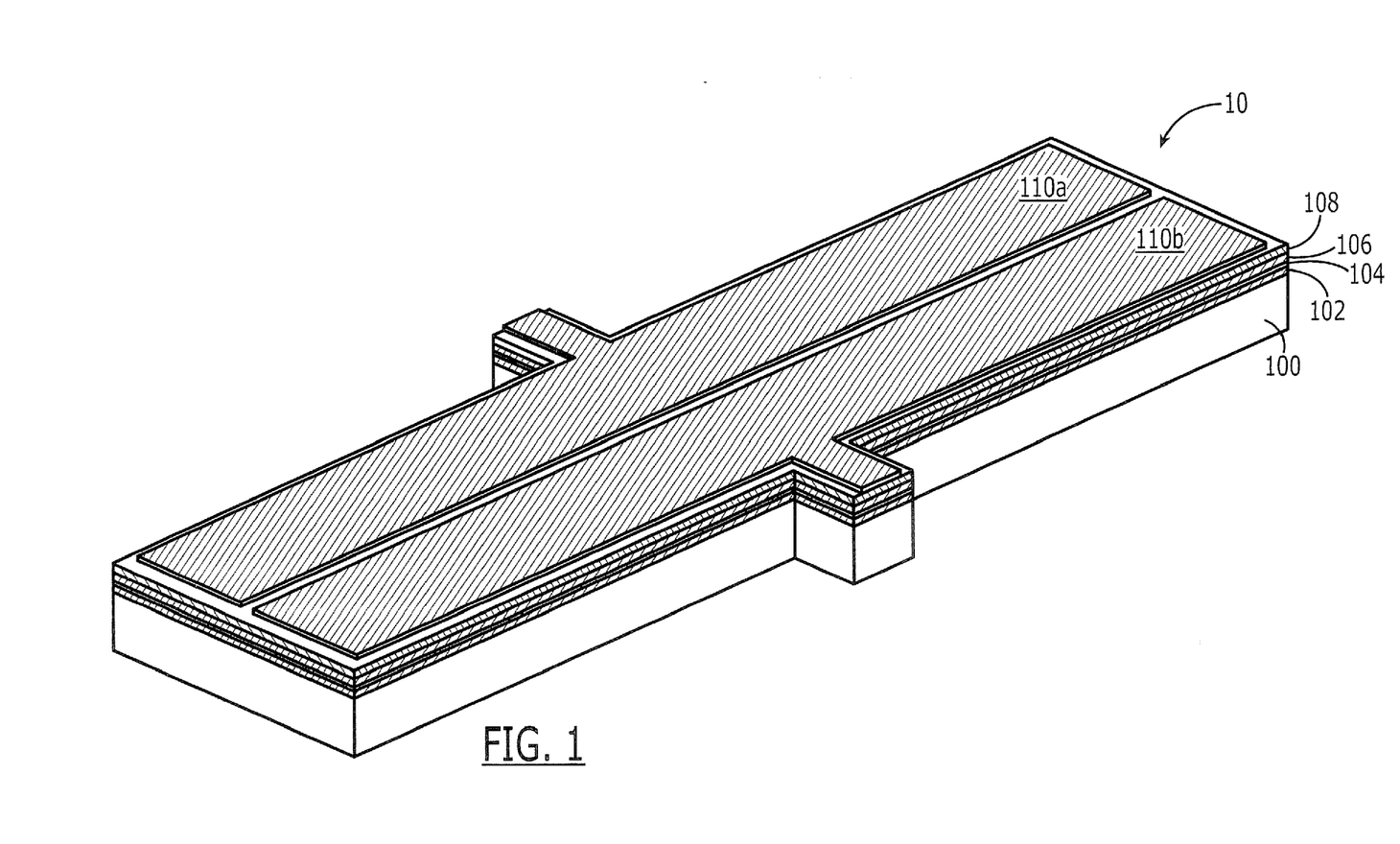
FIG. 1 is a perspective view of a portion of a thin-film bulk acoustic resonator according to an embodiment of the present invention.

FIG. 1 is a perspective view of a portion of a thin-film bulk acoustic resonator 10 according to an embodiment of the present invention. The illustrated portion of the resonator 10 includes a composite of layers that may be collectively anchored on opposite sides to a surrounding substrate (not shown). This surrounding substrate may include a recess therein that extends underneath the illustrated portion of the resonator 10. Thus, the illustrated portion of the resonator 10 may be anchored to the surrounding substrate in a manner similar to the anchoring techniques illustrated and described in U.S. application Ser. No. 12/233,395, filed Sep. 18, 2008, entitled "Single-Resonator Dual-Frequency Lateral-Extension Mode Piezoelectric Oscillators, and Operating Methods Thereof," and US 2008/0246559 to Ayazi et al., entitled "Lithographically-Defined Multi-Standard Multi-Frequency High-Q Tunable Micromechanical Resonators," the disclosures of which are hereby incorporated herein by reference.

The composite of layers within the resonator 10 include a resonator body 100, a compensation layer 102, which may be optional, an adhesion layer 104, which may be optional, a bottom electrode 106, a piezoelectric layer 108 and an at least one top electrode (110a, 110b). As will be understood by those skilled in the art, the resonator body 100 may be formed as a semiconductor body, such as a single crystal silicon (Si) body, a quartz body or a body of other suitable material having low acoustic loss. The compensation layer 102 may be formed as an electrically insulating dielectric layer, such as a silicon dioxide layer, a silicon nitride layer or another electrically insulating layer having a sufficiently positive temperature coefficient of elasticity.

The compensation layer 102 is illustrated as being formed directly on an upper surface of the resonator body 100, however, the compensation layer 102 may also be formed on an opposing bottom surface of the resonator body 100, according to alternative embodiments of the invention. The compensation layer 102 may operate to provide thermal compensation to the resonator 10.

The adhesion layer 104 is illustrated as being formed directly on an upper surface of the compensation layer 102. This adhesion layer 104, which may be formed of the same material as the piezoelectric layer 108, is provided between the compensation layer 102 (and/or resonator body 100) and the bottom electrode 106, which may be electrically biased at a fixed bias potential (e.g., reference voltage). This bottom electrode 106 may be formed as a metal layer, such as a molybdenum (Mo) or aluminum (Al) layer, for example. Other metals (e.g., Au, Ni) may also be used for the bottom electrode 106.

The resonator 10 further includes a piezoelectric layer 108 on the bottom electrode 106. This piezoelectric layer 108 may be formed of a piezoelectric material, such as aluminum nitride (AlN), zinc oxide (ZnO) or PZT, for example. The at least one top electrode is illustrated as including a first top electrode 110a, which may operate as an input electrode of the resonator 10, and a second top electrode 110b, which may operate as an output electrode of the resonator 10. The at least one top electrode and bottom electrode are preferably formed of the same materials.

As will now be described, by fixing the thicknesses of the resonator body 100, a relationship can be established between the combined thicknesses of the piezoelectric layer 108 and the adhesion layer 104, if any, and the combined thicknesses of the bottom electrode 106 and top electrodes 110a, 110b. This relationship may be used to reduce a susceptibility of the resonator 10 to process-induced variations in resonant frequency when the material thickness of the resonator body 100 deviates from its target thickness for a given resonator design. This reduction in susceptibility of the resonator 10 to process-induced variations in resonant frequency may be understood by modeling the resonant frequency of the resonator 10 as a function of the thickness ($t_i$), Young's modulus ($E_i$) and density ($\rho_i$) of the layers illustrated by FIG. 1, for the case where no compensation layer is present. This modeling can be illustrated by the following bulk acoustic wave equation, which applies to a three-material resonator containing a resonator body (1), a piezoelectric layer (2) and an electrode layer (3):

$$f = \frac{n}{2L}\sqrt{\frac{E_1 t_1 + E_2 t_2 + E_3 t_3}{\rho_1 t_1 + \rho_2 t_2 + \rho_3 t_3}} \quad (1)$$

where "n" is the order of mode and L is the frequency defining dimension. This equation can be reduced to a bulk acoustic wave equation for a simplified body-only (e.g., Si only) resonator, which is typically characterized as a resonator having a very low susceptibility to process-induced variations in resonant frequency when body thickness variations occur during fabrication. In particular, the reduction in the acoustic wave equation for a three-material resonator can be achieved by satisfying the following relationship between the combined thicknesses of the piezoelectric layer 108 and the adhesion layer 104, if any, and the combined thicknesses of the bottom electrode 106 and the top electrodes 110a, 110b:

$$1 = \sqrt{\frac{t_1 + \frac{E_2}{E_1}t_2 + \frac{E_3}{E_1}t_3}{t_1 + \frac{\rho_2}{\rho_1}t_2 + \frac{\rho_3}{\rho_1}t_3}} \quad (2)$$

This relationship can be further simplified to eliminate the thickness of the resonator body therefrom and establish a preferred ratio in thicknesses between the combined electrode layers ($t_3$) and the piezoelectric layer ($t_2$) (or piezoelectric layer and adhesion layer):

$$\frac{t_3}{t_2} = \frac{E_2 \rho_1 - E_1 \rho_2}{E_1 \rho_3 - E_3 \rho_1} \quad (3)$$

This simplified equation can be further reduced to a ratio of $t_3/t_2$ of about 0.12 based on the material characteristics of Si, AlN and Mo illustrated by TABLE 1, or about 0.46 based on the material characteristics of Si, AlN and Al.

TABLE 1

| MATERIAL | YOUNG'S MODULUS (GPa) | DENSITY (Kg/m³) |
|---|---|---|
| Si (1) | 169 | 2330 |
| AlN (2) | 295 | 3260 |
| Mo (3) | 220 | 9700 |
| Al (3') | 70 | 2700 |
| SiO$_2$ (4) | 73 | 2200 |

According to still further embodiments of the present invention, the above-described modeling can be extended to a four-material resonator containing a resonator body (1), a piezoelectric layer (2), an electrode layer (3) and a compensation layer (4). In particular, a reduction in the acoustic wave equation for a four-material resonator can be achieved by satisfying the following relationship between the combined thicknesses of the piezoelectric layer 108 and adhesion layer 104, if any, the combined thicknesses of the bottom electrode 106 and top electrodes 110a, 110b and the thickness of the compensation layer:

$$1 = \sqrt{\frac{t_1 + \frac{E_2}{E_1}t_2 + \frac{E_3}{E_1}t_3 + \frac{E_4}{E_1}t_4}{t_1 + \frac{\rho_2}{\rho_1}t_2 + \frac{\rho_3}{\rho_1}t_3 + \frac{\rho_4}{\rho_1}t_4}} \quad (4)$$

This equation can be further simplified to eliminate the thickness of the resonator body therefrom:

$$\frac{E_2}{E_1}t_2 + \frac{E_3}{E_1}t_3 + \frac{E_4}{E_1}t_4 = \frac{\rho_2}{\rho_1}t_2 + \frac{\rho_3}{\rho_1}t_3 + \frac{\rho_4}{\rho_1}t_4 \quad (5)$$

Moreover, by establishing a material and thickness of the compensation layer (4), the values of $E_4$, $\rho_4$ and $t_4$ become known, the desired value of $t_3$ can be computed once the target value of $t_2$ has been established (or vice versa).

Although not wishing to be bound by any theory, finite element simulation methods can be used to demonstrate the accuracy of the above analytical approach to reducing process-induced variations in resonant frequency for those cases where the resonator's frequency defining dimension (i.e., body length) is substantially larger than the width of the resonator body. However, for those cases where the resonator's frequency defining dimension is much smaller than the width of the resonator body, the analytical predictions can be off by a factor of about two when compared to the finite element simulation results. Accordingly, by combining the analytical predictions with finite element results, process-induced variations in resonant frequency can be reduced in a three-material resonator when the combined thickness "$t_3$" of the top and bottom electrodes is formed to be within the following range:

$$t_2 \left[\frac{E_2 \rho_1 - E_1 \rho_2}{E_1 \rho_3 - E_3 \rho_1}\right] \leq t_3 \leq 2 t_2 \left[\frac{E_2 \rho_1 - E_1 \rho_2}{E_1 \rho_3 - E_3 \rho_1}\right] \quad (6)$$

where "$t_2$" is the thickness of the piezoelectric layer; $E_1$, $E_2$ and $E_3$ are the Young's modulus of the resonator body, the piezoelectric layer and the bottom and top electrodes, respectively; and $\rho_1$, $\rho_2$ and $\rho_3$ are the densities of the resonator body, the piezoelectric layer and the bottom and top electrodes, respectively.

Similarly, by combining the analytical predictions with finite element results, process-induced variations in resonant frequency can be reduced in a four-material resonator when the combined thickness "$t_3$" of the top and bottom electrodes is formed to be within the following range:

$$\left[\frac{\frac{\rho_2}{\rho_1}t_2 + \frac{\rho_4}{\rho_1}t_4 - \frac{E_2}{E_1}t_2 - \frac{E_4}{E_1}t_4}{\frac{E_3}{E_1} - \frac{\rho_3}{\rho_1}}\right] \leq t_3 \leq 2 \left[\frac{\frac{\rho_2}{\rho_1}t_2 + \frac{\rho_4}{\rho_1}t_4 - \frac{E_2}{E_1}t_2 - \frac{E_4}{E_1}t_4}{\frac{E_3}{E_1} - \frac{\rho_3}{\rho_1}}\right] \quad (7)$$

where $t_2$ and $t_4$ are the thicknesses of the piezoelectric layer and the compensation layer, respectively; $E_1$, $E_2$, $E_3$ and $E_4$ are the Young's modulus of the resonator body, the piezoelectric layer, the bottom and top electrodes and the compensation layer, respectively; and $\rho_1$, $\rho_2$, $\rho_3$ and $\rho_4$ are the densities of the resonator body, the piezoelectric layer, the bottom and top electrodes and the compensation layer, respectively. Finite element simulation results further demonstrate that a preferred scaling factor of about 1.6 can be added to the left sides of equations (6) and (7) for those cases where the resonator's frequency defining dimension (i.e., body length) is not substantially larger than the width of the resonator body.

Figure 2A:
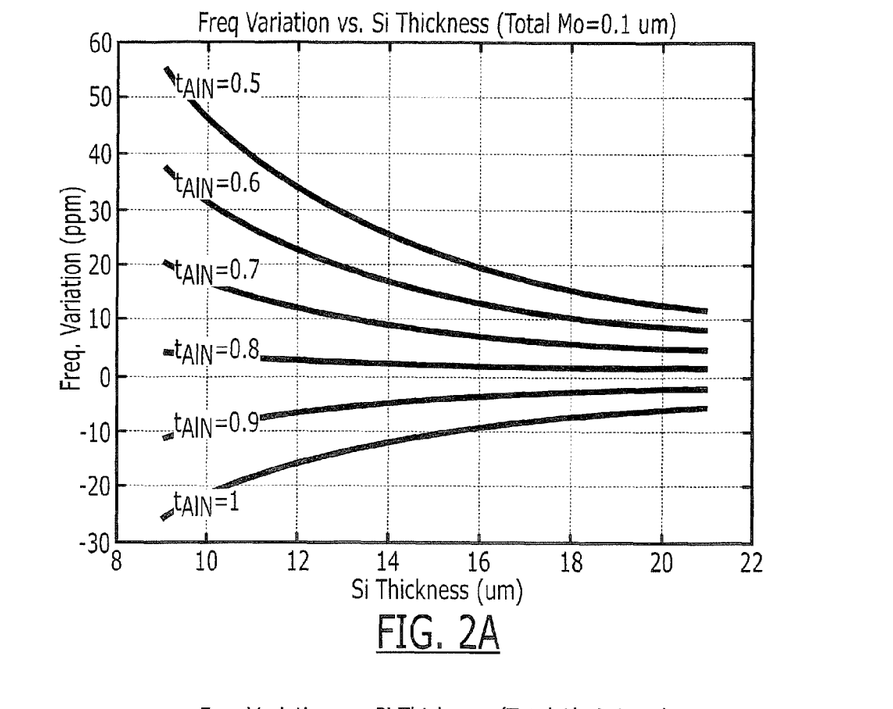
FIG. 2A is a graph illustrating frequency variation (ppm) versus silicon resonator body thickness, for thin-film bulk acoustic resonators having aluminum nitride (AlN) piezoelectric layers of varying thickness ranging from 0.5 to 1.0 microns and molybdenum (Mo) electrodes with a combined thickness of 0.1 microns.
Figure 2B:
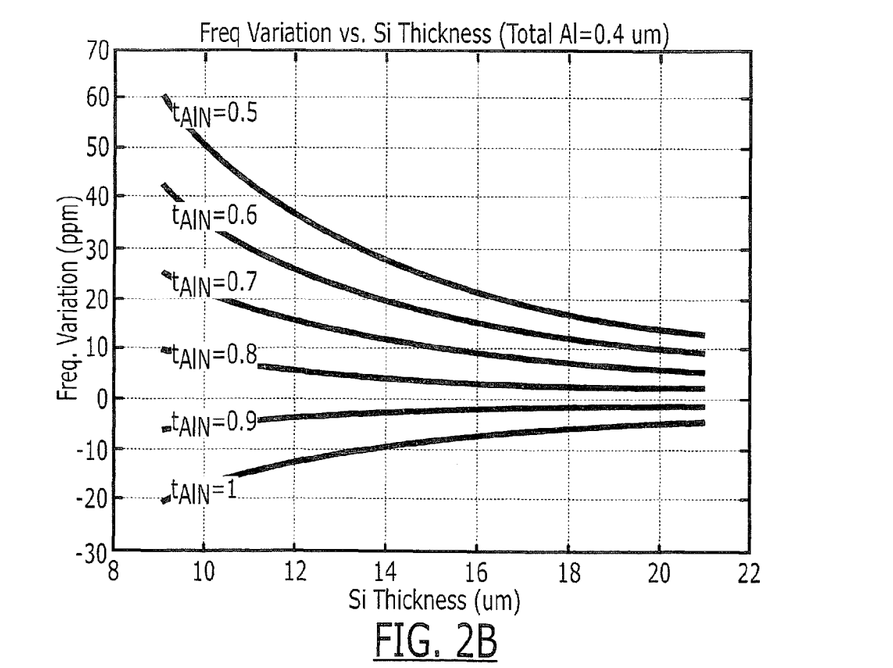
FIG. 2B is a graph illustrating frequency variation (ppm) versus silicon resonator body thickness, for thin-film bulk acoustic resonators having aluminum nitride (AlN) piezoelectric layers of varying thickness ranging from 0.5 to 1.0 microns and aluminum (Al) electrodes with a combined thickness of 0.4 microns.

The reduction in process-induced resonant frequency variations that can be achieved by maintaining the combined thickness of the electrodes within the designated ranges can be illustrated by FIGS. 2A-2C and 3A-3B. In particular, FIG. 2A is a graph illustrating frequency variation (ppm) versus silicon resonator body thickness, for thin-film bulk acoustic resonators having aluminum nitride (AlN) piezoelectric layers of varying thickness ranging from 0.5 to 1.0 microns and molybdenum (Mo) electrodes with a combined thickness of 0.1 microns. As illustrated, a $t_3/t_2$ ratio of 0.12 (Mo=0.1/AlN=0.83) yields a low level of process-induced resonant frequency variation for silicon resonator bodies having a target thickness of 20 microns. Alternatively, FIG. 2B illustrates frequency variation (ppm) versus silicon resonator body thickness, for thin-film bulk acoustic resonators having aluminum nitride (AlN) piezoelectric layers of varying thickness ranging from 0.5 to 1.0 microns and aluminum (Al) electrodes with a combined thickness of 0.4 microns. As illustrated by FIG. 2B, a $t_3/t_2$ ratio of 0.465 (Al=0.4/AlN=0.86) yields a low level of process-induced resonant frequency variation for silicon resonator bodies having a target thickness of 20 microns.

Figure 2C:
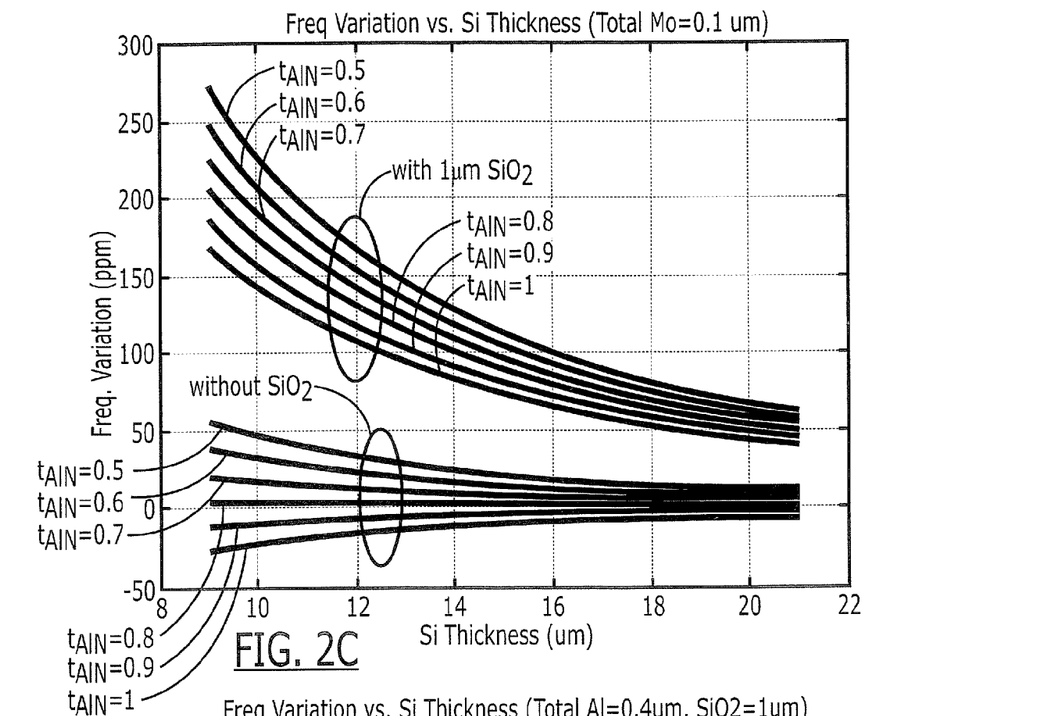
FIG. 2C is a graph illustrating frequency variation (ppm) versus silicon resonator body thickness, for: (i) thin-film bulk acoustic resonators having aluminum nitride (AlN) piezoelectric layers of varying thickness ranging from 0.5 to 1.0 microns and molybdenum (Mo) electrodes with a combined thickness of 0.1 microns; and (ii) thin-film bulk acoustic resonators having aluminum nitride (AlN) piezoelectric layers of varying thickness ranging from 0.5 to 1.0 microns, molybdenum (Mo) electrodes with a combined thickness of 0.1 microns and a 1.0 micron thick silicon dioxide compensation layer.

FIG. 2C is a graph illustrating frequency variation (ppm) versus silicon resonator body thickness, for: (i) thin-film bulk acoustic resonators having aluminum nitride (AlN) piezoelectric layers of varying thickness ranging from 0.5 to 1.0 microns and molybdenum (Mo) electrodes with a combined thickness of 0.1 microns; and (ii) thin-film bulk acoustic resonators having aluminum nitride (AlN) piezoelectric layers of varying thickness ranging from 0.5 to 1.0 microns, molybdenum (Mo) electrodes with a combined thickness of 0.1 microns and a 1.0 micron thick silicon dioxide compensation layer. As illustrated, the inclusion of a silicon dioxide compensation layer on a silicon resonator body increases the degree of process-induced resonant frequency variation relative to an otherwise equivalent device.

Figure 3A:
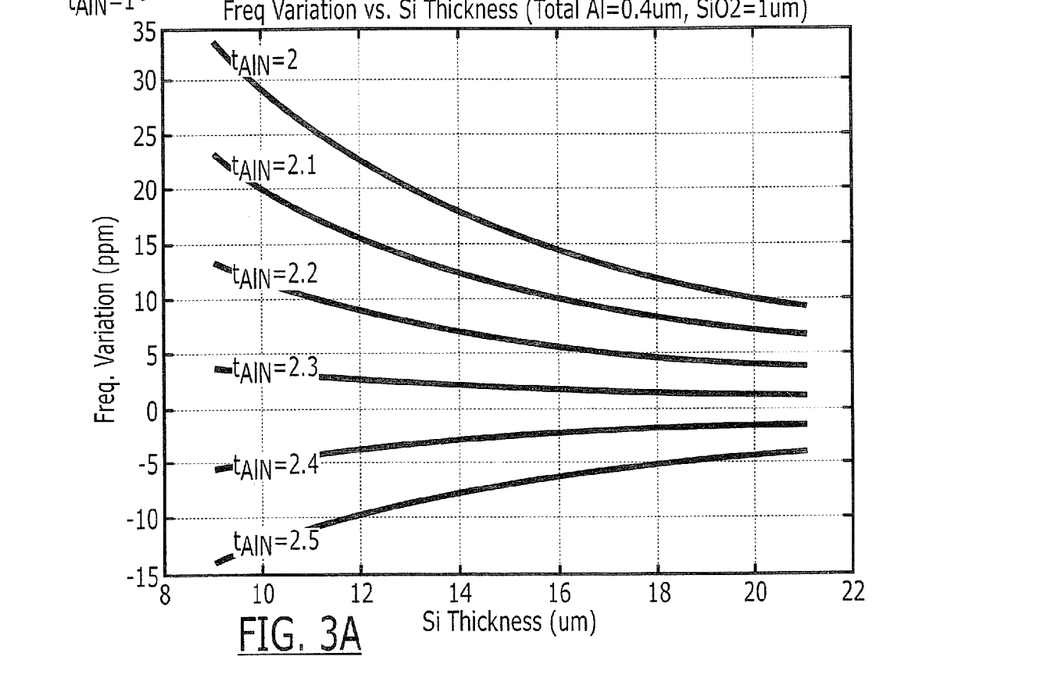
FIG. 3A is a graph illustrating frequency variation (ppm) versus silicon resonator body thickness, for thin-film bulk acoustic resonators having aluminum nitride (AlN) piezoelectric layers of varying thickness ranging from 2.0 to 2.5 microns, aluminum (Al) electrodes with a combined thickness of 0.4 microns and a 1.0 micron thick silicon dioxide compensation layer.

FIG. 3A is a graph illustrating frequency variation (ppm) versus silicon resonator body thickness, for thin-film bulk acoustic resonators having aluminum nitride (AlN) piezoelectric layers of varying thickness ranging from 2 to 2.5 microns, aluminum (Al) electrodes with a combined thickness of 0.4 microns and a 1.0 micron thick silicon dioxide compensation layer. As illustrated, a $t_3/t_2$ of about 0.17 (i.e., 0.4/2.3) yields a relatively low level of process-induced resonant frequency variation with the silicon resonator body has a thickness of about 20 microns. This value of 0.17 is consistent with a value predicted by a left side of equation (7) for the case where the resonator's frequency defining dimension (i.e., body length) is substantially larger than the width of the resonator body.

Figure 3B:
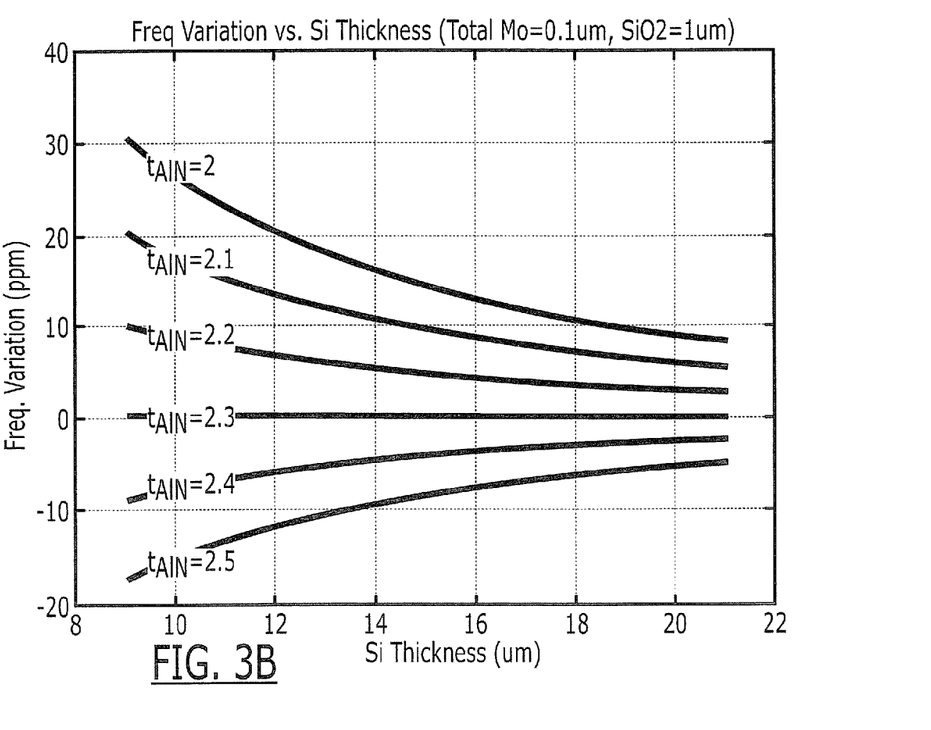
FIG. 3B is a graph illustrating frequency variation (ppm) versus silicon resonator body thickness, for thin-film bulk acoustic resonators having aluminum nitride (AlN) piezoelectric layers of varying thickness ranging from 2.0 to 2.5 microns, molybdenum (Mo) electrodes with a combined thickness of 0.1 microns and a 1.0 micron thick silicon dioxide compensation layer.

Similarly, FIG. 3B is a graph illustrating frequency variation (ppm) versus silicon resonator body thickness, for thin-film bulk acoustic resonators having aluminum nitride (AlN) piezoelectric layers of varying thickness ranging from 2 to 2.5 microns, molybdenum (Mo) electrodes with a combined thickness of 0.1 microns and a 1.0 micron thick silicon dioxide compensation layer. As illustrated, a $t_3/t_2$ of about 0.043 (i.e., 0.1/2.3) yields a relatively low level of process-induced resonant frequency variation with the silicon resonator body has a thickness of about 20 microns. This value of 0.043 is consistent with a value predicted by a left side of equation (7) for the case where the resonator's frequency defining dimension (i.e., body length) is substantially larger than the width of the resonator body.

Figure 4A:
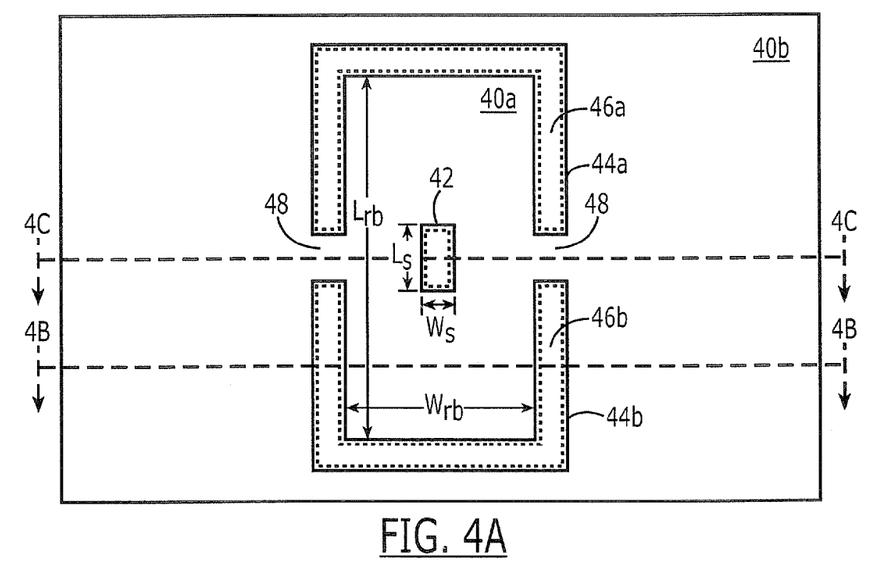
FIG. 4A is a plan view of a micro-electromechanical acoustic resonator, according to embodiments of the present invention.
Figure 4B:
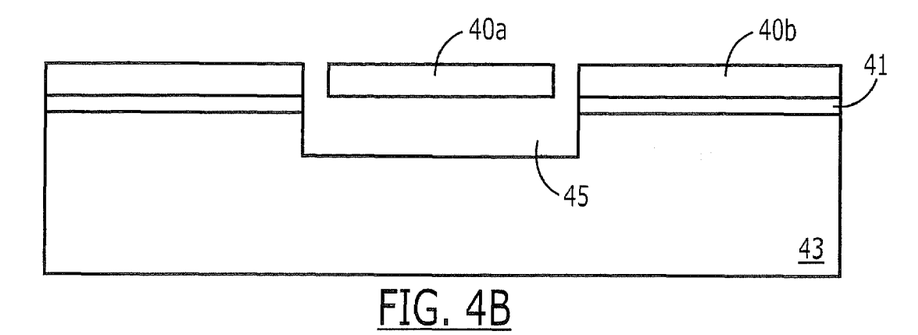
FIG. 4B is a cross-sectional view of the resonator of FIG. 4A, taken along line 4B-4B.
Figure 4C:
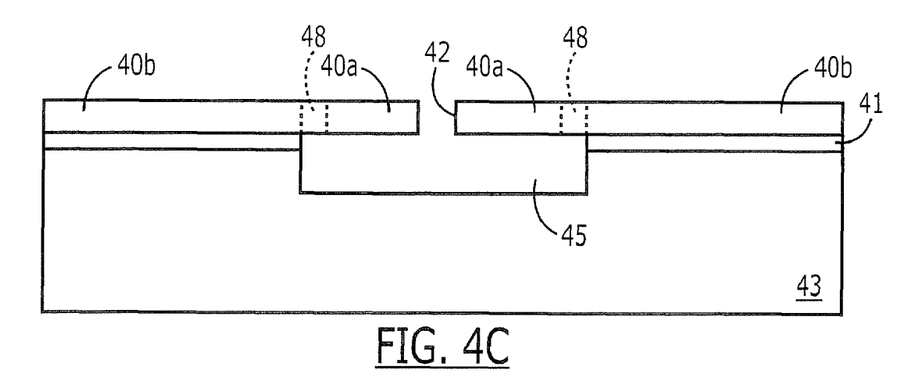
FIG. 4C is a cross-sectional view of the resonator of FIG. 4A, taken along line 4C-4C.

Referring now to FIGS. 4A-4C, a micro-electromechanical acoustic resonator according to additional embodiments of the present invention includes a resonator body 40a suspended over a recess 45 in a substrate, which is illustrated as including a supporting layer 43 and an electrically insulating layer 41 (e.g., silicon dioxide layer) on the supporting layer 43. The supporting layer 43 may be a semiconductor substrate (e.g., silicon substrate), however, other materials may also be used. The resonator body 40a is anchored on opposing sides (e.g., by tabs 48) to a surrounding region 40b, which may be formed of the same material as the resonator body 40a. For example, the resonator body 40a may be formed by photolithographically patterning a single crystal silicon layer to define trench patterns 44a, 44b therein, which extends entirely through the single crystal silicon layer. The trench patterns 44a, 44b separate a majority of the resonator body 40a from the surrounding region 40b by a pair of through-body trenches 46a, 46b, as illustrated. In some embodiments of the invention, the resonator body 40a and surrounding region 40b may have a thickness of about 20 microns, for example.

The resonator body 40a is illustrated as having a single rectangular-shaped perforation/slot 42 therein, which extends completely through the resonator body 40a. According to alternative embodiments of the present invention, the perforation/slot 42 may extend substantially (e.g., at least 50%) through the resonator body 40a. Although not wishing to be bound by any theory, it is believed that an extension of the perforation 42 completely through the resonator body 40a provides a much greater degree of compensation for process-induced variations in resonant frequency relative to an otherwise equivalently shaped and located perforation that does not extend completely through the resonator body 40a. The lateral dimensions of the resonator body 40a are illustrated as $L_{rb}$ (length) and $W_{rb}$ (width) and the lateral dimensions of the perforation 42 are illustrated as $L_s$ (length) and $W_s$ (width).

These dimensions of the resonator body 40a and perforation 42 are influenced by the photolithographic patterning and trench etching of the single crystal silicon layer. Accordingly, any variation in the actual widths of the trenches 46a, 46b can cause a two times variation in the lateral dimensions of the resonator body 40a. Moreover, as will be understood by those skilled in the art, any variations in the actual widths of the trenches 46a, 46b and perforation 42 (as shown by the dotted lines within these regions in FIG. 4A) can be caused by variations in photolithographic patterning as well as variations in the sidewall profiles of the resonator body 40a that occur during the etching process (e.g., dry etching process, such as DRIE).

Figure 4D:
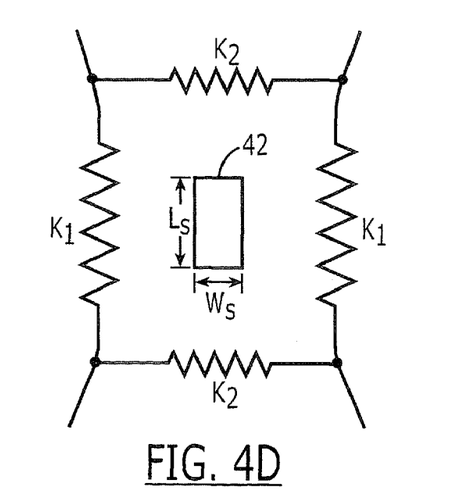
FIG. 4D is a simplified mechanical model of the resonator of FIG. 4A.

Referring now to FIG. 4D, the addition of the single perforation 42 at the center of the resonator body 40a, as illustrated by FIG. 4A, can be treated, for modeling purposes, as dividing the resonator body 40a into two parallel resonators (springs K1). These two resonators K1, which extend on opposing sides (e.g., left and right) of the body 40a and are separated by the perforation 42, are mechanically coupled by two coupling springs K2. Each of these coupling springs K2 extends across a respective end of the body 40a. The coupling springs K2 operate to counteract process-induced changes in the stiffness-to-mass ratio of the resonators K1 that may be caused by lateral dimension variations. For example, in an uncompensated resonator (i.e., without perforation 42), a process-induced increase in the lateral dimension of the resonator body 40a will typically cause a decrease in resonant frequency resulting from a decrease in the stiffness-to-mass ratio of each resonator K1. However, with the addition of the perforation 42, the characteristics of the coupling springs K2, which also change in response to lateral dimension variations, compensate for changes in the stiffness-to-mass ratios of the resonators K1. Based on this compensation, the resonator body 40a becomes less susceptible to process-induced variations in resonant frequency caused by process-induced lateral dimension variations.

Although not wishing to be bound by any theory, the susceptibility of the acoustic resonator to process-induced resonant frequency variations can be further reduced by proper placement of the perforation 42 within the resonator body 40a. In particular, the perforation 42 can be patterned so that during resonant frequency operation, a nodal line in the resonator body (i.e., the line that remains at rest while other portions of the body are in a state of vibration) passes across an interior of the perforation 42. In additional embodiments of the present invention, the perforation 42 can be patterned so that a projected point of maximum stress in the resonator body 40a is within an interior of the perforation 42. In some embodiments of the invention, this location of the projected point of maximum stress during resonant frequency operation can be met by dimensioning the resonator body 40a and perforation 42 so that a center-of-mass of the resonator body 40a is within an interior of the perforation 42. Thus, in some embodiments of the invention, the center-of-mass and projected point of maximum stress may overlap and in other embodiments of the present invention the center-of-mass of the resonator body may be located on the nodal line.

According to still further embodiments of the present invention, process-induced resonant frequency variations can be further reduced by setting one dimension of the perforation 42 to be equal to the widths of trench patterns 44a, 44b, so that the photolithography and etch biases for the perforation 42 and trench patterns 44a, 44b will be more uniform. In particular, the resonator body 40a can be configured so that a sidewall of the resonator body 40a can be separated from an opposing sidewall of the supporting substrate by a distance equivalent to a width of the single perforation 42. Moreover, to further reduce process-induced changes in resonant frequency caused by dimension variations, the length ($L_s$) and width ($W_s$) of the single perforation 42 may be related to a length ($L_{rb}$) and a width ($W_{rb}$) of the resonator body 40a by the following relationship:

$$(0.4)L_{rb}(W_s/2(L_{rb}-W_{rb}+W_s))^{1/2} \leq L_s \leq (0.6)L_{rb}(W_s/2(L_{rb}-W_{rb}+W_s))^{1/2},$$

In meeting this relationship, the resonator body 40a may be configured so that the body length ($L_{rb}$) is greater than the body width ($W_{rb}$), and the perforation length ($L_s$) is greater than the perforation width ($W_s$). According to still further embodiments of the present invention, the above relationship may be further limited so that:

$$L_s = (s_f)L_{rb}(W_s/2(L_{rb}-W_{rb}+W_s))^{1/2},$$

where $s_f$ is a scaling factor equal to about 0.5 for the case where $L_s > W_s$.

Figure 5A:
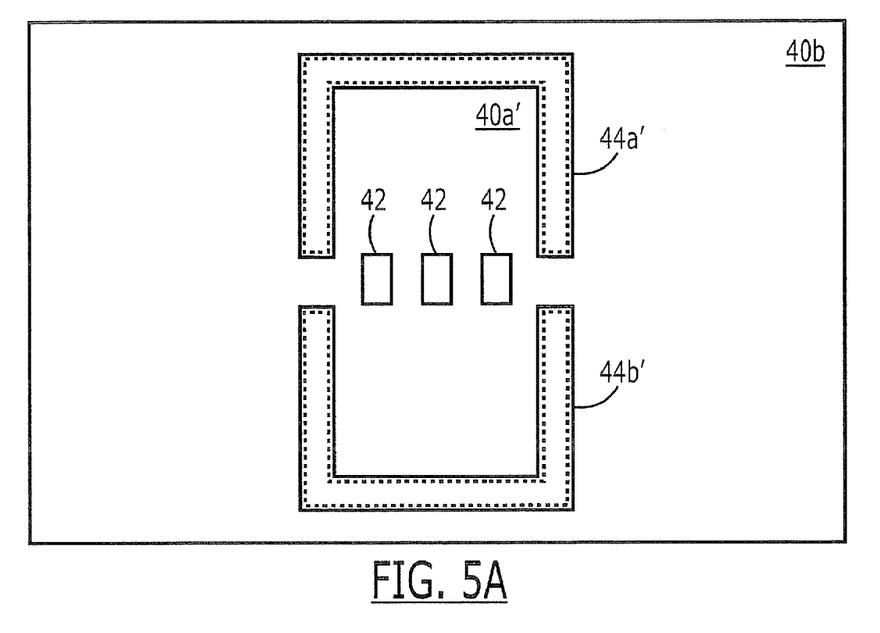
FIGS. 5A-5B are plan views of micro-electromechanical acoustic resonators, according to additional embodiments of the present invention.

The resonator embodiments of FIGS. 4A-4D may be modified by increasing the number of perforations within a resonator body. As illustrated by FIG. 5A, a resonator body 40a' may be provided with three perforations 42 therein, for the case where $L_{rb} > W_{rb}$. The perforations 42 may be arranged in a straight line between the opposing points of anchor, which attach the resonator body 40a' to the surrounding region 40b. In particular, the perforations 42 may be arranged along a nodal line of the resonator body 40a'. Alternative shapes and locations of the perforations may also be possible. The dimensions of the anchors are defined by the trench patterns 44a' and 44b'.

Figure 5B:
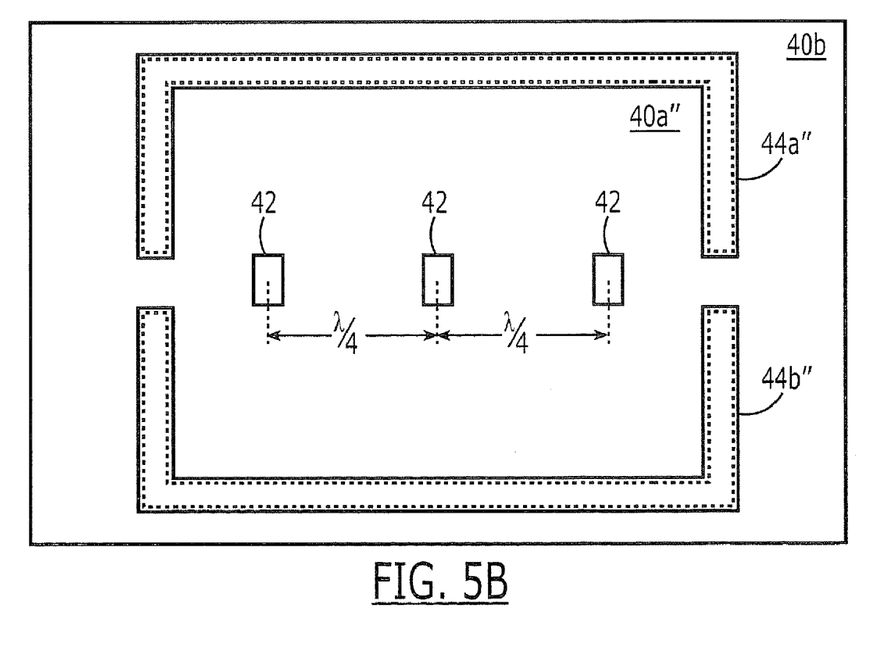

Similarly, as illustrated by FIG. 5B, a resonator body 40a'' may be provided with three perforations 42 therein, for the case where $L_{rb} < W_{rb}$. The perforations 42, which can have the same or different dimensions in some cases, may be arranged in a straight line between the opposing points of anchor, which attach the resonator body 40a'' to the surrounding region 40b. The dimensions of the anchors are defined by the trench patterns 44a'' and 44b''. Thus, as illustrated by FIG. 5B, a resonator body 40a'' may have N>1 perforations therein. Moreover, the widths of the perforations 42 may be equal to the widths of the trench patterns 44a'' and 44b''. The dimensions of the perforations 42 can also be related to a length ($L_{rb}$) and a width ($W_{rb}$) of the resonator body 40a'' by the following relationship:

$$(0.4)L_{rb}(W_s/2(L_{rb}-(W_{rb}/N)+W_s))^{1/2} \leq L_s \leq (0.6)L_{rb}(W_s/2(L_{rb}-(W_{rb}/N)+W_s))^{1/2},$$

for the case where the body length ($L_{rb}$) is less than the body width ($W_{rb}$). The resonator body 40a'' may also be configured to have a center-of-mass within an interior of the middle one of the plurality of perforations 42. The center-to-center pitch between the perforations 42 may also be designed to be equal to $\lambda/4$, where $\lambda$ is a wavelength associated with a resonant frequency of the resonator body 40a''.

Figure 6A:
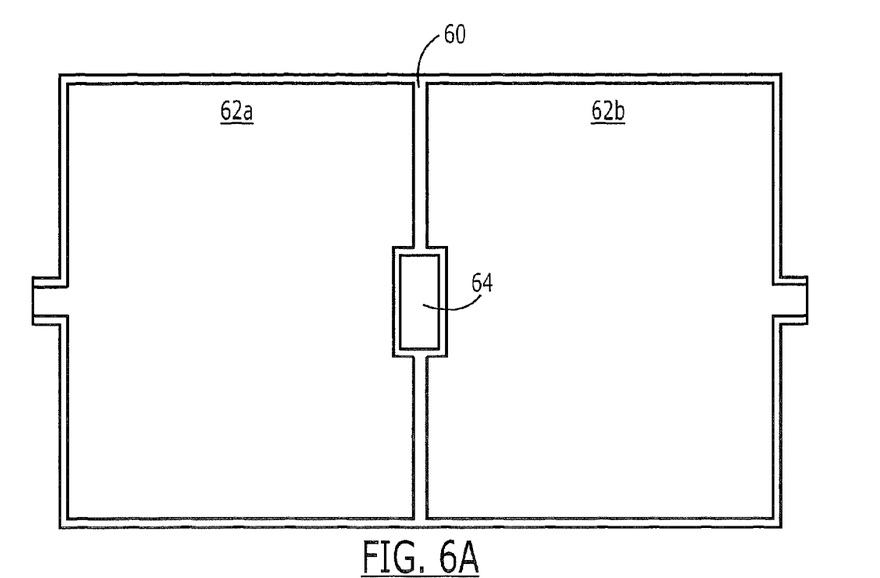
FIGS. 6A-6C are plan views of micro-electromechanical acoustic resonators, according to still further embodiments of the present invention.
Figure 6B:
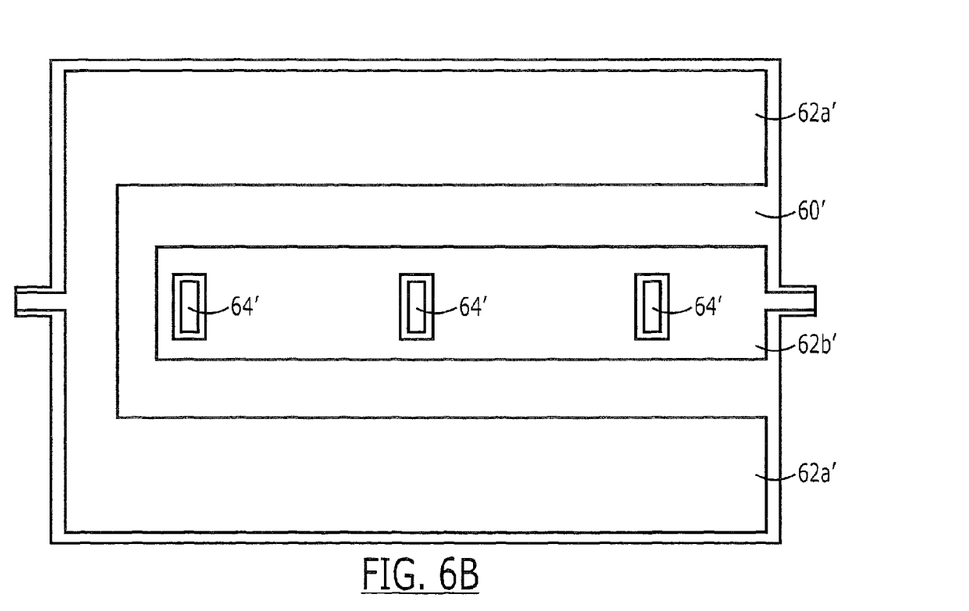
Figure 6C:
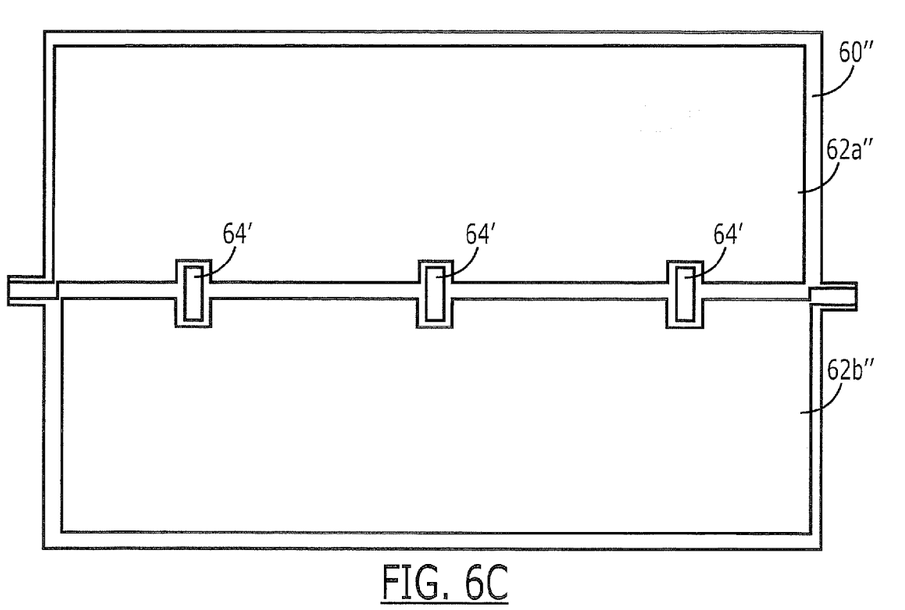

Referring now to FIG. 6A, a resonator body 60 according to an embodiment of the present invention includes a single perforation 64, which is located along a nodal line of the resonator body. The center-of-mass of the resonator body 60 is also located within the single perforation 64. First and second electrodes 62a and 62b are also provided, which partially surround the central perforation 64. FIG. 6B illustrates a resonator body 60' with three perforations 64' therein that are spaced apart from each other at equivalent center-to-center pitches. The center-to-center pitch may correspond to $\lambda/4$, where $\lambda$ is a wavelength associated with a resonant frequency of the resonator body 60'. First and second electrodes 62a' and 62b' are also provided. The first electrode 62a' has two fingers that extend along opposing ends of the resonator body 60' and the second electrode 62b' extends along the nodal line of the resonator body 60' and surrounds each of the three perforations 64', as illustrated. FIG. 6C illustrates a resonator body 60'' with three perforations 64' therein that are spaced apart from each other at equivalent center-to-center pitches. First and second electrodes 62a'' and 62b'' are also provided. These first and second electrodes 62a'' and 62b'' extend in parallel to each other, in a direction orthogonal to a direction of vibration of the resonator body 60'' when the resonator body 60'' is operating at a resonant frequency.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. A micro-electromechanical acoustic resonator, comprising:

a resonator body suspended over a substrate, said resonator body having a single perforation therein extending at least substantially therethrough at a location that overlaps with a nodal line of said resonator body when said resonator body is operating at resonant frequency, said resonator body having a sidewall that is separated from an opposing sidewall of the substrate by a distance equivalent to a width of the single perforation.

2. The resonator of claim 1, wherein a perimeter and depth of the single perforation is configured to reduce a susceptibility of the resonator to process-induced variations in resonant frequency relative to an otherwise equivalent resonator that omits the single perforation.

3. The resonator of claim 1, wherein said resonator body is anchored on opposite sides to the substrate.

4. The resonator of claim 3, wherein said resonator body is suspended opposite a recess in the substrate.

5. The resonator of claim 1, wherein a length ($L_s$) and the width ($W_s$) of the single perforation is related to a length ($L_{rb}$) and a width ($W_{rb}$) of said resonator body by the following relationship:

$$(0.4)L_{rb}(W_s/2(L_{rb}-W_{rb}+W_s))^{1/2} \leq L_s \leq (0.6)L_{rb}(W_s/2(L_{rb}-W_{rb}+W_s))^{1/2},$$

where the length ($L_{rb}$) is greater than the width ($W_{rb}$), and the length ($L_s$) is greater than the width ($W_s$).

6. The resonator of claim 5, wherein said resonator body and the single perforation are rectangular shaped.

7. The resonator of claim 1, wherein said resonator body and the single perforation are rectangular shaped.

8. A micro-electromechanical acoustic resonator, comprising:
a resonator body suspended over a substrate, said resonator body having a single perforation therein extending at least substantially therethrough at a location that overlaps with a nodal line of said resonator body when said resonator body is operating at resonant frequency, said single perforation having a length ($L_s$) and a width ($W_s$) that is related to a length ($L_{rb}$) and a width ($W_{rb}$) of said resonator body by the following relationship:

$$(0.4)L_{rb}(W_s/2(L_{rb}-W_{rb}+W_s))^{1/2} \leq L_s \leq (0.6)L_{rb}(W_s/2(L_{rb}-W_{rb}+W_s))^{1/2},$$

where the length ($L_{rb}$) is greater than the width ($W_{rb}$), and the length ($L_s$) is greater than the width ($W_s$).

9. The resonator of claim 8, wherein said resonator body and the single perforation are rectangular shaped.

10. A micro-electromechanical acoustic resonator, comprising:
a resonator body anchored on opposite sides to a substrate having a recess therein extending underneath said resonator body, said resonator body having at least one perforation therein extending at least substantially therethrough, said at least one perforation having a length ($L_s$) and a width ($W_s$) that are related to a length ($L_{rb}$) and a width ($W_{rb}$) of said resonator body by the following relationship:

$$(0.4)L_{rb}(W_s/2(L_{rb}-W_{rb}+W_s))^{1/2} \leq L_s \leq (0.6)L_{rb}(W_s/2(L_{rb}-W_{rb}+W_s))^{1/2},$$

where the length ($L_{rb}$) is greater than the width ($W_{rb}$), and the length ($L_s$) is greater than the width ($W_s$).

11. The resonator of claim 10, wherein the at least one perforation is aligned with a nodal line of said resonator body.

12. The resonator of claim 10, wherein the at least one perforation extends entirely through said resonator body.

13. The resonator of claim 10, wherein said resonator body and the at least one perforation are rectangular shaped.

14. A micro-electromechanical acoustic resonator, comprising:
a resonator body anchored on opposite sides to a substrate having a recess therein extending underneath said resonator body, said resonator body having N perforations therein extending at least substantially therethrough, with at least one of the N perforations having a length ($L_s$) and width ($W_s$) that are related to a length ($L_{rb}$) and a width ($W_{rb}$) of said resonator body by the following relationship:

$$(0.4)L_{rb}(W_s/2(L_{rb}-(W_{rb}/N)+W_s))^{1/2} \leq L_s \leq (0.6)L_{rb}(W_s/2(L_{rb}-(W_{rb}/N)+W_s))^{1/2},$$

where the length ($L_{rb}$) is less than the width ($W_{rb}$) and "N" is an integer greater than one.

15. The resonator of claim 14, wherein the N perforations are arranged along a nodal line of said resonator body.

16. The resonator of claim 15, wherein a center-to-center pitch between the N perforations is equivalent to $\lambda/4$, where $\lambda$ is a wavelength associated with a resonant frequency of the resonator.

17. The resonator of claim 14, wherein said resonator body is configured to have a center-of-mass within an interior of one of the N perforations.

18. The resonator of claim 17, wherein the N perforations are arranged along a nodal line of said resonator body.

19. The resonator of claim 14, wherein said resonator body is configured to have a projected point of maximum stress within an interior of one of the N perforations when said resonator body is operating at a resonant frequency.

20. The resonator of claim 14, wherein said resonator body and the N perforations are rectangular shaped.

* * * * *